(12) United States Patent
Inoue et al.

(10) Patent No.: US 10,199,605 B2
(45) Date of Patent: Feb. 5, 2019

(54) ORGANIC ELECTROLUMINESCENCE DEVICE AND METHOD FOR MANUFACTURING ORGANIC ELECTROLUMINESCENCE DEVICE

(71) Applicant: Sharp Kabushiki Kaisha, Sakai, Osaka (JP)

(72) Inventors: Satoshi Inoue, Sakai (JP); Katsuhiro Kikuchi, Sakai (JP); Hideki Uchida, Sakai (JP); Eiji Koike, Sakai (JP); Masanori Ohara, Sakai (JP); Yuto Tsukamoto, Sakai (JP); Yoshiyuki Isomura, Sakai (JP); Kazuki Matsunaga, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 65 days.

(21) Appl. No.: 15/527,713

(22) PCT Filed: Nov. 13, 2015

(86) PCT No.: PCT/JP2015/081993
§ 371 (c)(1),
(2) Date: May 18, 2017

(87) PCT Pub. No.: WO2016/080310
PCT Pub. Date: May 26, 2016

(65) Prior Publication Data
US 2018/0358577 A1    Dec. 13, 2018

(30) Foreign Application Priority Data
Nov. 20, 2014 (JP) ................................. 2014-235767

(51) Int. Cl.
*H01L 29/04* (2006.01)
*H01L 29/10* (2006.01)
(Continued)

(52) U.S. Cl.
CPC ...... *H01L 51/5271* (2013.01); *H01L 51/5206* (2013.01); *H01L 51/5234* (2013.01); *H01L 51/56* (2013.01)

(58) Field of Classification Search
USPC .................................. 257/40, 59; 438/149
See application file for complete search history.

(56) References Cited

U.S. PATENT DOCUMENTS 5,834,893 A * 11/1998 Bulovic ................. B82Y 10/00
313/506
6,091,195 A * 7/2000 Forrest ................ H01L 51/5271
313/504
(Continued)

FOREIGN PATENT DOCUMENTS

JP    2003-229283 A    8/2003
JP    2004-119147 A    4/2004
(Continued)

*Primary Examiner* — Lex Malsawma
*Assistant Examiner* — Eric W Jones
(74) *Attorney, Agent, or Firm* — ScienBiziP, P.C.

(57) ABSTRACT

An organic EL device according to one aspect of the present invention includes: a base material; a first recess provided on a top surface of the base material; a reflective layer provided along a surface of the first recess; a filling layer filled in the first recess, the filling layer including a top surface on which a second recess is provided; a first electrode provided on an upper layer side of the filling layer; an organic layer comprising a light emitting layer provided on an upper layer side of the first electrode; and a second electrode provided on an upper layer side of the organic layer. Within the organic layer, a part of a light emitting area interposed between the first electrode and the second electrode is positioned inside the second recess The reflective layer is in contact with the first electrode in a periphery of the first recess.

8 Claims, 9 Drawing Sheets

Figure 1:
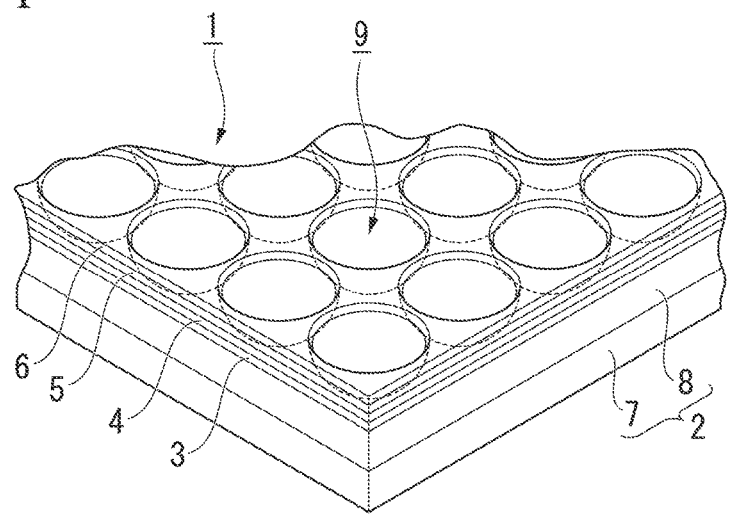

(51) Int. Cl.
    *H01L 31/00*     (2006.01)
    *H01L 51/52*     (2006.01)
    *H01L 51/56*     (2006.01)

(56) References Cited

U.S. PATENT DOCUMENTS

| | | | | |
|---|---|---|---|---|
| 7,449,724 | B2* | 11/2008 | Yamazaki | H01S 5/0425 257/98 |
| 7,502,392 | B2* | 3/2009 | Nomura | H01S 5/0425 313/499 |
| 9,496,522 | B2* | 11/2016 | Burrows | H01L 51/56 |
| 2014/0264291 | A1* | 9/2014 | Zhang | H01L 51/5271 257/40 |
| 2015/0060832 | A1* | 3/2015 | Ito | H01L 51/5225 257/40 |

FOREIGN PATENT DOCUMENTS

| | | |
|---|---|---|
| JP | 2005-331665 A | 12/2005 |
| JP | 2006-221902 A | 8/2006 |
| JP | 2010-157404 A | 7/2010 |

\* cited by examiner

ORGANIC ELECTROLUMINESCENCE DEVICE AND METHOD FOR MANUFACTURING ORGANIC ELECTROLUMINESCENCE DEVICE

TECHNICAL FIELD

Some aspects of the present invention relate to an organic electroluminescence device and a method for manufacturing an organic electroluminescence device.

Priority is claimed on Japanese Patent Application No. 2014-235767, filed Nov. 20, 2014, the content of which is incorporated herein by reference.

BACKGROUND ART

As one form of a display device, a self-luminous type display device, for example, an organic electroluminescence display device, is known.

Electro-luminescence will be abbreviated as "EL" below. In an organic EL display device, light emitted from a light emitting layer travels in all directions, and some of the light is totally reflected due to a refractive index difference between a light emitting element and an external space (air). Most of the light totally reflected at the interface between the light emitting element and the air is confined in the light emitting element and is not extracted to the external space. For example, when the refractive index of the light emitting layer is 1.8, about 20% of the light emitted from the light emitting layer is extracted to the external space and the remaining about 80% of light is confined in the light emitting layer. As a result, the organic EL device of the related art has a problem of low light use efficiency.

In the following Patent Document 1, an organic EL display device including a support substrate, an organic EL element provided on the support substrate, and a light reflection layer at which light emitted from the organic EL element is reflected is disclosed. In the organic EL display device, in the light reflection layer, a recess including an inclined surface along the outer edge of an organic light-emitting layer is provided. Light emitted from the organic light-emitting layer is reflected at the inclined surface of the recess and then returns to the organic EL element again. In such a configuration, it is possible to prevent degradation of image quality such as bleeding and improve light use efficiency, which are described in the Patent Document 1.

PRIOR ART DOCUMENTS

Patent Documents

[Patent Document 1]
Japanese Patent Application Publication No. 2003-229283

SUMMARY OF THE INVENTION

Problem to be Solved by the Invention

However, even in the organic EL display device disclosed in Patent Document 1, a large amount of light is confined inside the organic light-emitting layer and an effect of increasing light use efficiency is insufficient. Here, although the organic EL display device is exemplified, a problem of a low light use efficiency is not limited to when a display device is used, but is a common problem when an illumination device is used.

Some aspects of the present invention provide an organic EL device having excellent light use efficiency and a method for manufacturing an organic EL device.

Means for Solving the Problems

An organic EL device according to one aspect of the present invention includes: a base material; a first recess provided on a top surface of the base material; a reflective layer provided along at least a surface of the first recess; a filling layer filled in the first recess, the filling layer including a top surface on which a second recess is provided, the filling layer having light transmissivity; a first electrode provided on an upper layer side of at least the filling layer, the first electrode having light transmissivity; an organic layer including a light emitting layer provided on an upper layer side of the first electrode; and a second electrode provided on an upper layer side of the organic layer, the second electrode having light transmissivity and light reflectivity, wherein, within the organic layer, at least a part of a light emitting area interposed between the first electrode and the second electrode is positioned inside the second recess, and wherein the reflective layer is in contact with the first electrode in a periphery of the first recess.

In the organic EL device according to one aspect of the present invention, a topmost part of the filling layer may be positioned lower than an edge of the reflective layer formed in the first recess.

In the organic EL device according to one aspect of the present invention, the reflective layer may form a concave reflective surface along the surface of the first recess, wherein, among a plurality of planes perpendicular to the top surface of the base material, at least a part of a cross-sectional shape of the concave reflective surface cut along at least one plane may include a curve line having a focus, and wherein the focus may be included in the light emitting area inside the second recess.

In the organic EL device according to one aspect of the present invention, among a plurality of planes perpendicular to the top surface of the base material, a cross-sectional shape of the concave reflective surface cut along at least one plane may be an arc shape.

In the organic EL device according to one aspect of the present invention, among a plurality of planes perpendicular to the top surface of the base material, a cross-sectional shape of the concave reflective surface cut along at least one plane may be a parabolic curve.

In the organic EL device according to one aspect of the present invention, an insulating layer having an aperture including at least the second recess viewed from the top surface in a normal direction may be provided on an upper layer side of the first electrode and a lower layer side of the second electrode, wherein the light emitting area may be positioned inside the aperture.

In the organic EL device according to one aspect of the present invention, the organic EL device may include: a plurality of unit display areas, wherein the unit display areas may include the plurality of first recesses.

A method for manufacturing an organic EL device according to one aspect of the present invention includes: a process of forming a first recess on a top surface of a base material; a process of forming a reflective layer provided along at least a surface of the first recess, the reflective layer including a concave reflective surface containing a curve line having a focus in at least a part of a cross-sectional shape; a process of forming a filling layer in which a second recess that is open upward is provided, wherein a resin layer having photosensitivity and light transmissivity fills the first recess, light is then emitted from the top surface in a normal direction, light reflected at the concave reflective surface is focused at the focus, and the resin layer positioned at the focus is exposed and removed; a process of forming a first electrode having light transmissivity on an upper layer side of at least the filling layer; a process of forming an organic layer including a light emitting layer on an upper layer side of the first electrode; and a process of forming a second electrode having light transmissivity and light reflectivity on an upper layer side of the organic layer.

Effect of the Invention

According to an aspect of the present invention, it is possible to realize an organic EL device having excellent light use efficiency.

BRIEF DESCRIPTIONS OF THE DRAWINGS

Figure 2:
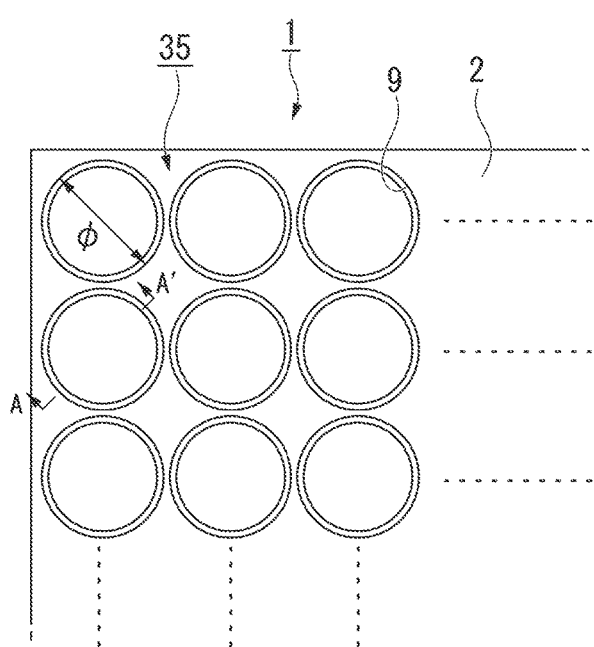
Figure 3:
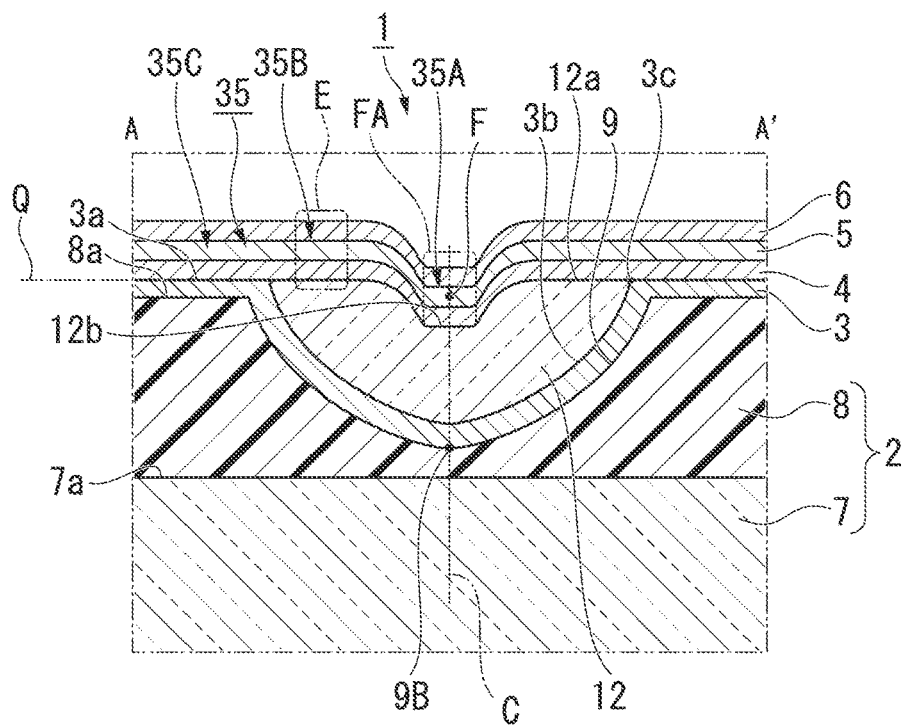
Figure 4:
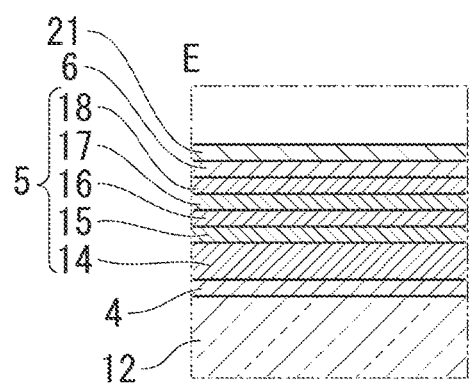
Figure 5:
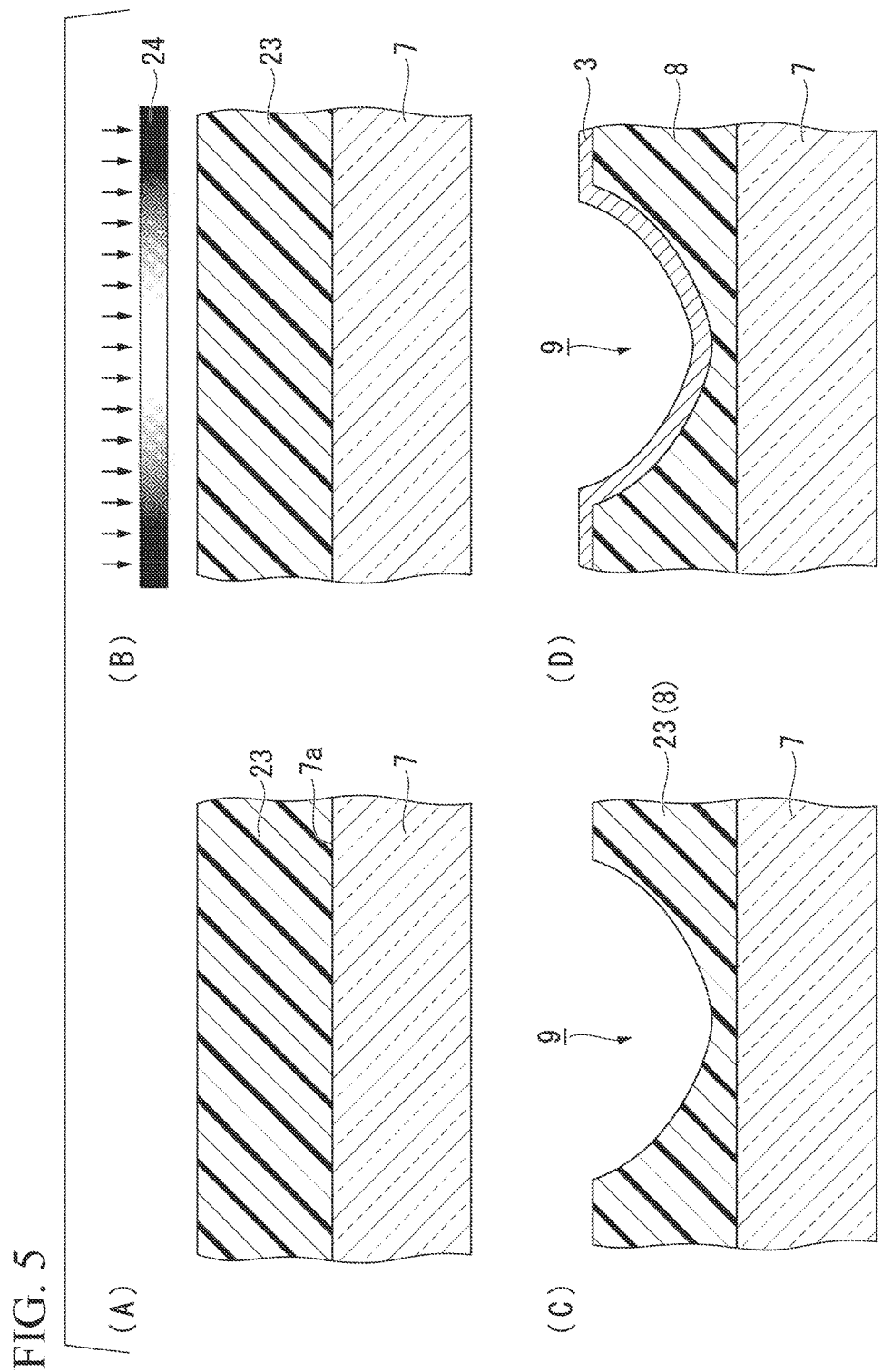
Figure 6:
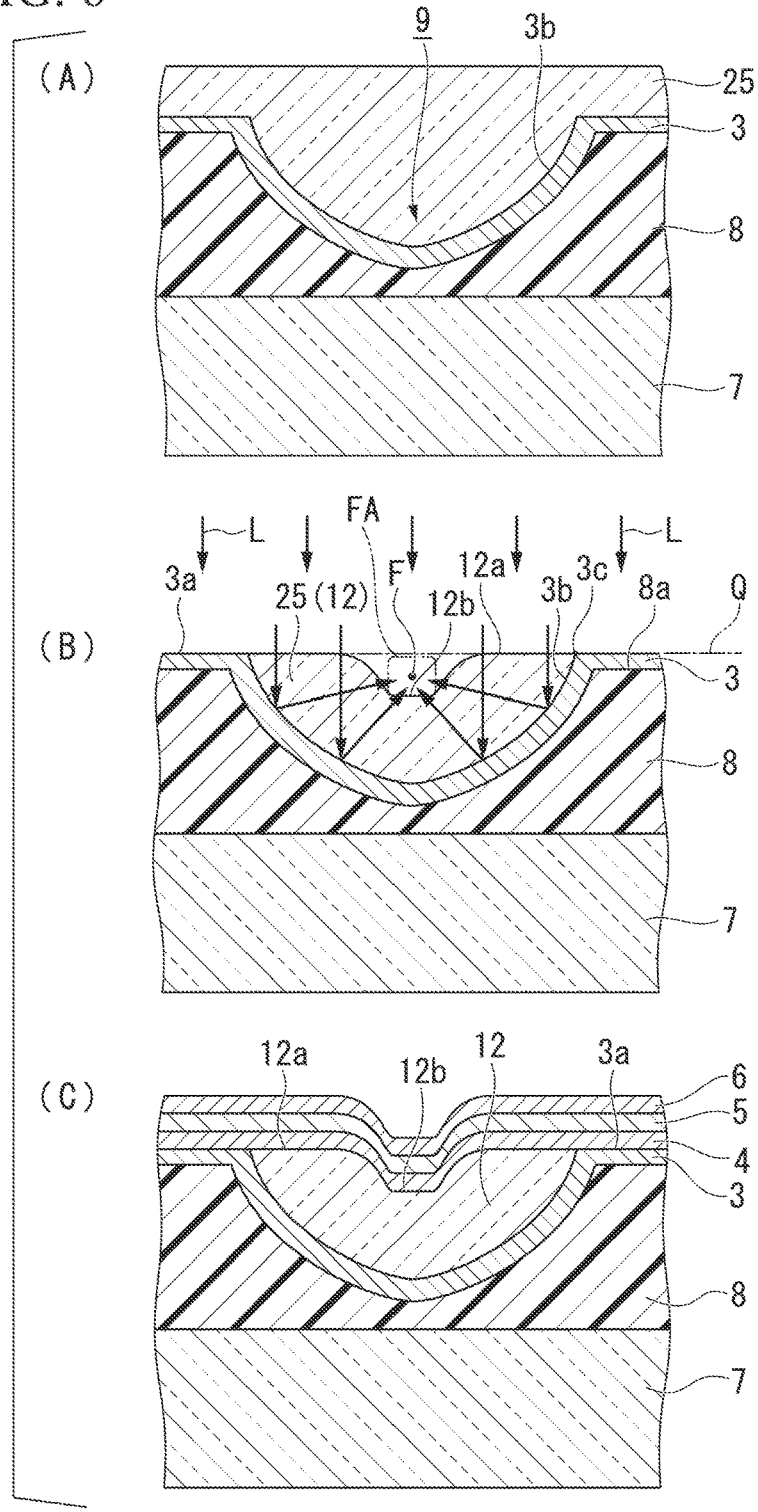
Figure 7:
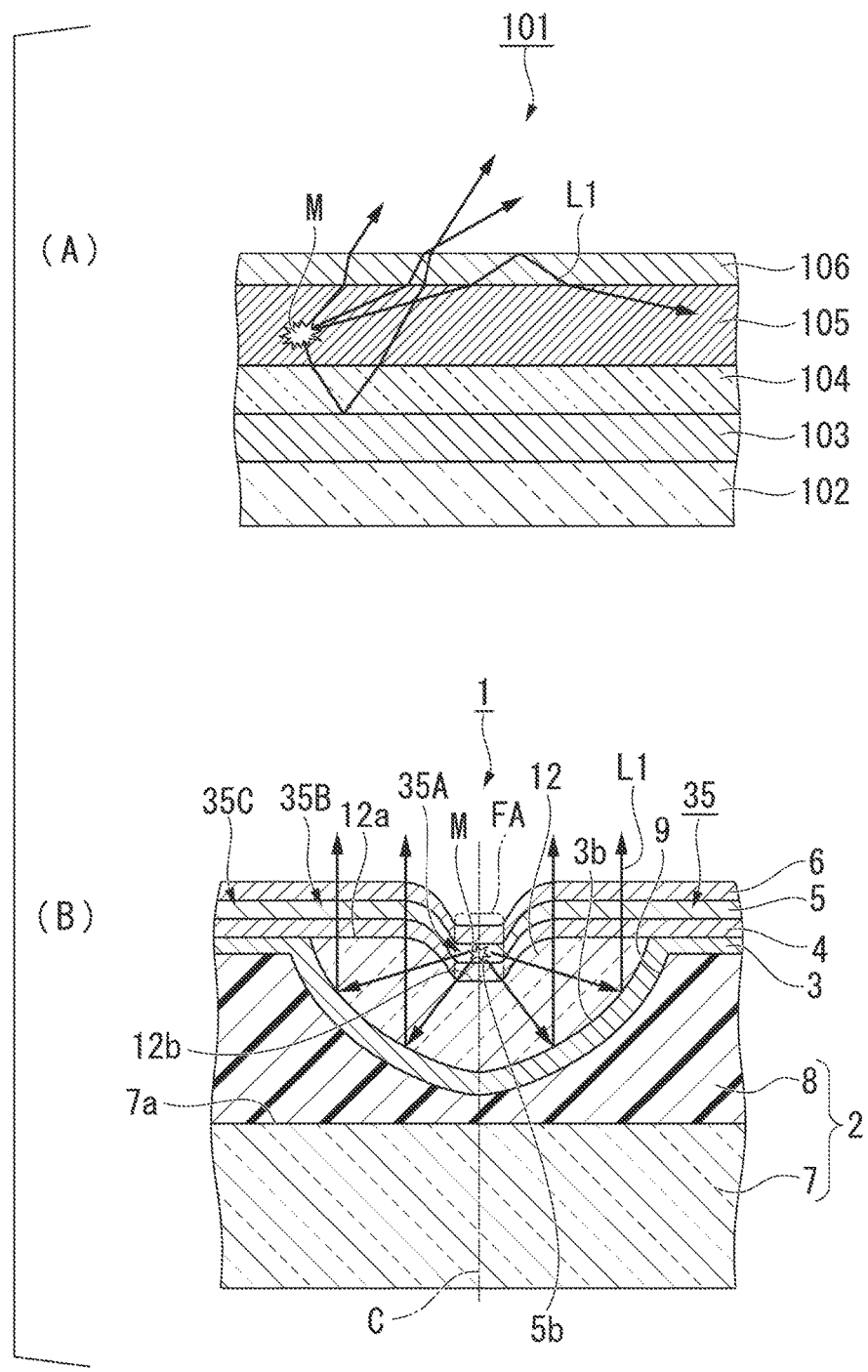
Figure 8:
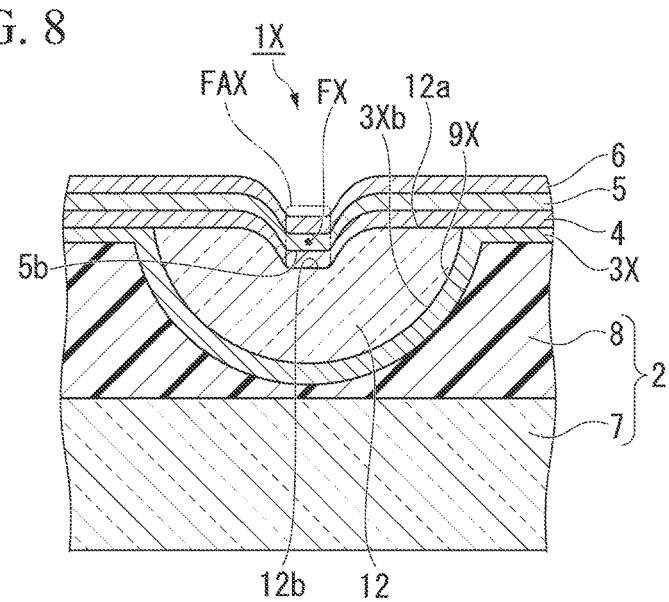
Figure 9:
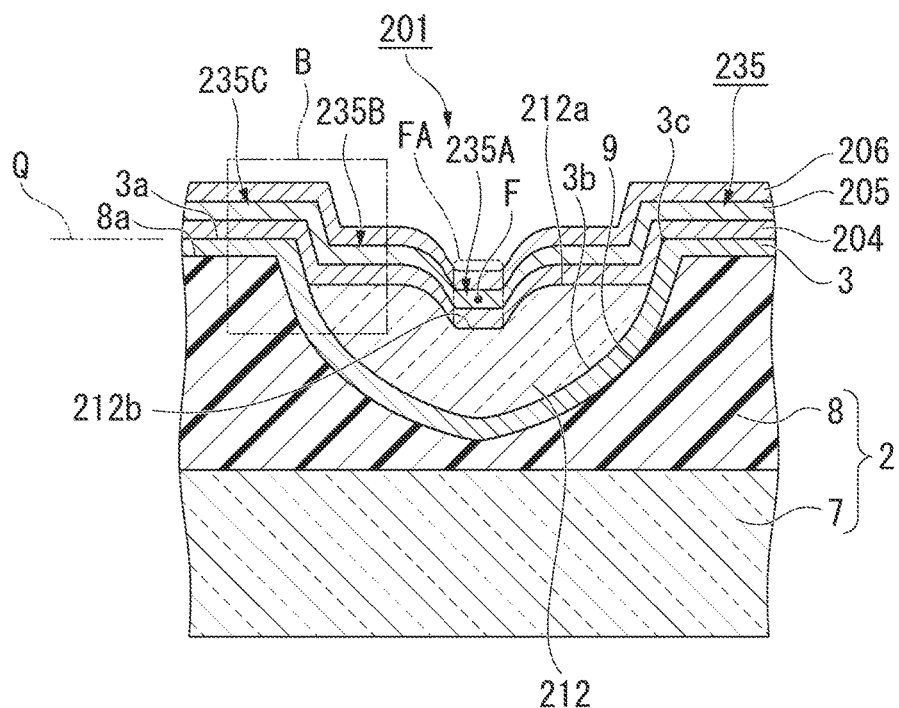
Figure 10:
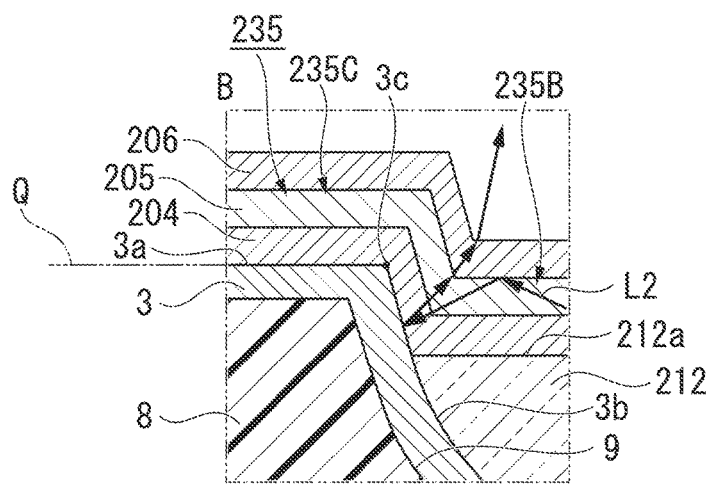
Figure 11:
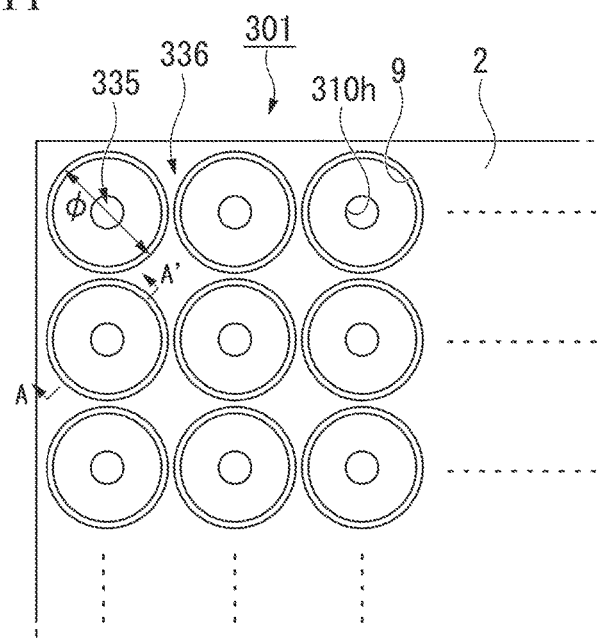
Figure 12:
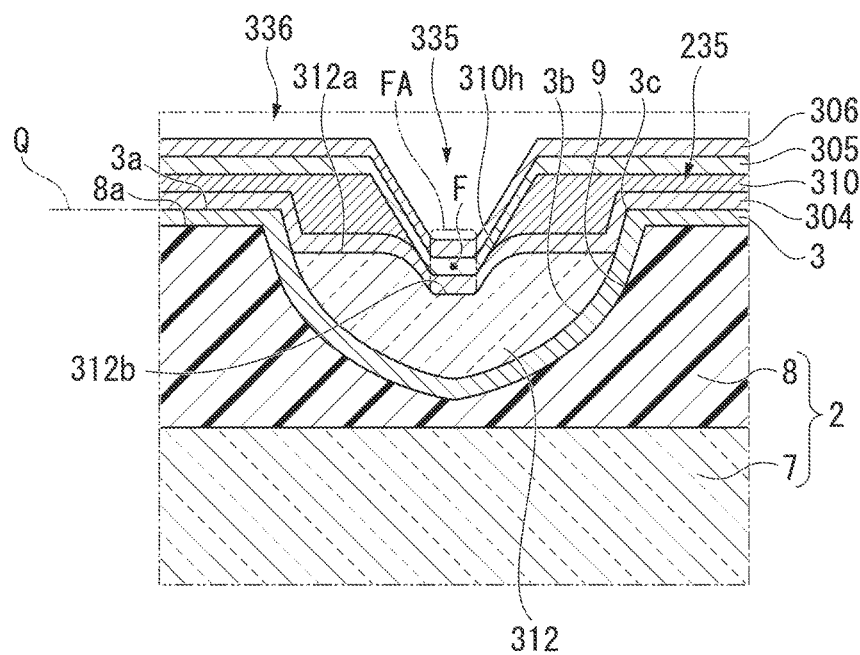
Figure 13:
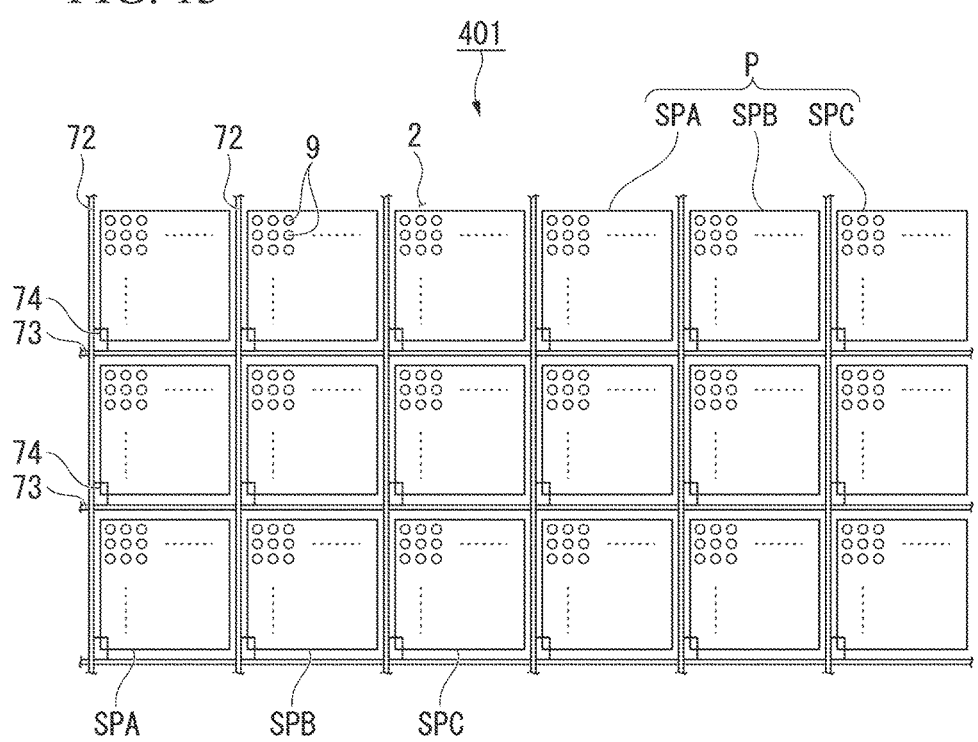

FIG. 1 is a perspective view showing an organic EL device according to a first embodiment.
FIG. 2 is a plan view of an organic EL device.
FIG. 3 is a cross-sectional view along the line A-A' in FIG. 2.
FIG. 4 is a cross-sectional view of a detailed configuration of an organic layer.
FIG. 5 shows cross-sectional views (A) to (D) in processes of manufacturing an organic EL device.
FIG. 6 shows cross-sectional views (A) to (C) in manufacturing processes following the manufacturing process in FIG. 5.
FIG. 7(A) is a cross-sectional view for describing a problem of an organic EL device in the related art, and FIG. 7(B) is a cross-sectional view for describing an operation of an organic EL device according to the present embodiment.
FIG. 8 is a cross-sectional view showing an organic EL device according to a modification.
FIG. 9 is a cross-sectional view of an organic EL device according to a second embodiment.
FIG. 10 is an enlarged view of an enlarged area B in FIG. 9.
FIG. 11 is a plan view of an organic EL device according to a third embodiment.
FIG. 12 is a cross-sectional view along the line A-A' in FIG. 11.
FIG. 13 is a plan view of an organic EL device according to a fourth embodiment.

EMBODIMENTS FOR CARRYING OUT THE INVENTION

First Embodiment

A first embodiment of the present invention will be described below with reference to FIG. 1 to FIG. 7.
An organic EL device of the first embodiment is one example of a top emission type organic EL device.
FIG. 1 is a perspective view of the organic EL device of the first embodiment.
Note that, in the following drawings, scales of sizes may be indicated differently for different elements in order for the elements to be easy to view.
As shown in FIG. 1, an organic EL device 1 of the present embodiment includes a base material 2, a reflective layer 3, a first electrode 4, an organic layer 5 including a light emitting layer, and a second electrode 6. The organic EL device 1 is a top emission type organic EL device, and light emitted from the light emitting layer is emitted from the second electrode 6. The base material 2 includes a substrate 7 and an underlayer 8. On a top surface of the substrate 7, the underlayer 8, the reflective layer 3, the first electrode 4, the organic layer 5, and the second electrode 6 are laminated in that order from the substrate 7. A plurality of first recesses 9 are provided on a top surface (a light emission surface) of the organic EL device 1.

The organic EL device 1 of the present embodiment is, for example, a green light emitting element configured to emit green light. In addition, the organic EL device 1 may be a red light emitting element configured to emit red light or a blue light emitting element configured to emit blue light. The green light emitting element, the red light emitting element and the blue light emitting element have the same configuration except that a constituent material of a light emitting layer differs. In addition, the organic EL device 1 may simultaneously emit, for example, red light, green light and blue light. In this case, the organic EL device 1 can be used as an illumination device configured to emit, for example, white light. However, applications of the organic EL device 1 are not limited to this illumination device. For example, the organic EL device 1 may be applied to a display device in which a red light emitting element, a green light emitting element, and a blue light emitting element are subdivided to form a red subpixel, a green subpixel, and a blue subpixel, and these three subpixels constitute one pixel.

FIG. 2 is a plan view of an enlarged part of the organic EL device 1 viewed from a top surface in a normal direction.
The organic EL device 1 has a planar square shape, and the length of one side of the square is, for example, about 100 mm.
As shown in FIG. 2, the organic EL device 1 includes the base material 2 and the plurality of first recesses 9 provided in the base material 2. When viewed from a top surface of the base material 2 in a normal direction, the first recess 9 has a circular planar shape. The diameter φ of the first recess 9 is, for example, about 5 μm. The plurality of first recesses 9 are disposed regularly in vertical and horizontal directions. The plurality of first recesses 9 are disposed close to each other in a vertical direction and a lateral direction.

FIG. 3 is a cross-sectional view of the organic EL device 1 taken along a plane perpendicular to a top surface of the base material 2 and is a cross-sectional view along the line A-A' in FIG. 2.
As shown in FIG. 3, the underlayer 8 is laminated on a top surface 7a of the substrate 7. As a material of the substrate 7, for example, a glass substrate is used. Here, since the organic EL device 1 is a top emission type organic EL device, the substrate 7 does not necessarily have light transmissivity, and a semiconductor substrate, for example, a silicon substrate, may be used.

On a part of a top surface 8a of the underlayer 8, the first recesses 9 that open upward are provided. Within the top surface 8a of the underlayer 8, an area other than the area in which the first recesses 9 are provided has a flat surface. At least a part of the cross-sectional shape of the first recess 9 includes a curve line having a focus.

Specifically, in the present embodiment, an inner surface of the first recess 9 is a parabolic surface (a surface having a parabolic shape) having a rotationally symmetric shape with a lowest point 9B at the center of the first recess 9 and with a center along a central axis C perpendicular to the top surface 7a of the substrate 7. Therefore, the cross-sectional shape of the first recess 9 has the same parabolic curve when it is cut along a plane in any direction as long as it is a plane perpendicular to the top surface 7a of the substrate 7. In the following description, the shape of the recess may be referred to as a parabolic shape.

While a parabolic curve is used as a curve line having a focus in the present embodiment, in addition to a parabolic curve, other conic curves having a focus, for example, arc, elliptical arc, and hyperbolic curves, may be used. In addition, there are countless planes perpendicular to the top surface of the base material, but it is sufficient for at least a part of the cross-sectional shape of the recess cut along at least one plane to include a curve line having a focus. For example, the upper side of the recess may be linearly inclined.

The underlayer 8 is formed of a photosensitive resin, for example, an acrylic, epoxy, or polyimide resin. When a photosensitive resin is used as the material of the underlayer 8, this is suitable for a method of forming the first recesses 9 to be described below. However, when a method other than the formation method to be described below is used, a constituent material of the underlayer 8 may not necessarily have photosensitivity. In addition, the constituent material of the underlayer 8 may not be a resin, and an inorganic material may be used. While the base material 2 including the substrate 7 and the underlayer 8 is used in the present embodiment, an underlayer is not necessarily used and recesses may be formed in the substrate 7 itself.

The reflective layer 3 is formed on the top surface 8a of the underlayer 8 including inner surfaces of the first recesses 9. As a constituent material of the reflective layer 3, a highly reflective metal, for example, aluminum or silver, is suitably used. In the present embodiment, the reflective layer 3 is formed of, for example, an aluminum film having a film thickness of 100 nm.

In the reflective layer 3, a concave reflective surface 3b is formed on a portion covering the inner surface of the first recess 9 and a flat surface 3a is formed on a portion other than the first recess 9. An edge 3c is positioned at a boundary between the flat surface 3a and the concave reflective surface 3b of the reflective layer 3. In addition, since the reflective layer 3 is provided along a surface of the first recess 9, among a plurality of planes perpendicular to a top surface of the base material 2 (that is, the top surface 8a of the underlayer 8), at least a part of the cross-sectional shape of the concave reflective surface 3b cut along at least one plane includes a curve line having a focus F. More specifically, since the first recess 9 includes a parabolic curved surface having the focus F, the concave reflective surface 3b has a parabolic shape. In addition, the concave reflective surface 3b forms a focus area FA in the peripheral vicinity of the focus F. The focus area FA is an area in which, when light is emitted to the concave reflective surface 3b from the top surface 8a in a normal direction, a certain amount or more of light reflected at the concave reflective surface 3b is collected. Here, "a certain amount or more of light" means an amount of light sufficient for the filling layer 12 to be exposed in a method of forming a filling layer 12 described in a later section.

The first recesses 9 are filled with the filling layer 12. On a top surface 12a of the filling layer 12, a second recess 12b that opens upward is provided from the focus area FA of the concave reflective surface 3b.

The second recess 12b is positioned to overlap and correspond to the focus area FA that the concave reflective surface 3b forms. Within the top surface 12a of the filling layer 12, an area other than the area in which the second recess 12b is provided has a flat surface or has a surface that is inclined toward the second recess 12b.

The topmost part of the top surface 12a of the filling layer 12 is formed to have substantially the same height as the edge 3c of the reflective layer 3. That is, the filling layer 12 is formed not to protrude higher than a plane Q including the edge 3c of the reflective layer 3. In addition, a bottom of the second recess 12b is positioned lower than the plane Q.

The filling layer 12 is formed of a resin having light transmissivity. In addition, when a photosensitive resin is used as the material of the filling layer 12, this is suitable for a method of forming the second recess 12b to be described below. However, when a method other than the formation method to be described below is used, a constituent material of the filling layer 12 may not necessarily have photosensitivity. Specifically, for example, a photosensitive acrylic resin is used as the material of the filling layer 12. A refractive index of the filling layer 12 of the present embodiment is, for example, 1.5.

The first electrode 4 is formed over the top surface 12a of the filling layer 12 and the flat surface 3a of the reflective layer 3. Within the first electrode 4, a portion positioned on the top surface 8a of the underlayer 8 is in contact with a part of the reflective layer 3. At a position inside the first recess 9, a bottom surface of the first electrode 4 is in contact with the top surface 12a of the filling layer 12. Since the second recess 12b is formed on the top surface 12a of the filling layer 12, a part of the first electrode 4 is formed inside the second recess 12b. The first electrode 4 is a transparent electrode formed of a transparent conductive film of, for example, indium tin oxide (ITO) or indium zinc oxide (IZO), and has light transmissivity. In the present embodiment, the first electrode 4 is formed of, for example, IZO having a film thickness of 100 nm. The first electrode 4 functions as a positive electrode for injecting holes into the organic layer.

The organic layer 5 is laminated along a top surface of the first electrode 4. The organic layer 5 is interposed between the first electrode 4 and the second electrode 6 to form a light emitting area 35. In addition, a part of the organic layer 5 is formed inside the second recess 12b. Therefore, a part of the light emitting area 35 is positioned inside the second recess 12b in a plan view (that is, a field of view from the top surface 8a in a normal direction). Within the light emitting area 35, a portion positioned inside the second recess 12b in a plan view is set as a first light emitting area 35A. Within the light emitting area 35, a portion that is positioned outside the second recess 12b and positioned inside the first recess 9 in a plan view is set as a second light emitting area 35B. In addition, within the light emitting area 35, a portion positioned outside the first recess 9 in a plan view is set as a third light emitting area 35C. A bottom surface of the organic layer 5 inside the second recess 12b is positioned lower than the plane Q including the edge 3c.

The organic layer 5 is a laminate formed of an organic material including a hole injecting layer, a hole transporting layer, a light emitting layer, an electron transporting layer and an electron injecting layer. Detailed configurations and functions of the layers forming the organic layer 5 will be described below.

The second electrode 6 is laminated along a top surface of the organic layer 5. The second electrode 6 is a translucent electrode formed of a thin metal film of, for example, silver, or a magnesium silver alloy. That is, the second electrode 6 has both light transmissivity and light reflectivity, and transmits a part of incident light and reflects the rest. In the second electrode 6, a metal having a low work function is suitably used. For example, Ag, Al, a magnesium alloy (such as MgAg), and an aluminum alloy (such as AlLi, AlCa, and AlMg) may be used. In the present embodiment, the second electrode 6 is formed of a laminated film, for example, an MgAg alloy having a film thickness of 1 nm and Ag having a film thickness of 19 nm. The second electrode 6 functions as a negative electrode for injecting electrons into the organic layer 5. In addition, although not shown in FIG. 3, an optical adjustment layer called a cap layer is laminated on a top surface of the second electrode 6.

FIG. 4 is a cross-sectional view showing a detailed configuration of the organic layer 5. FIG. 4 shows an enlarged portion marked with the letter E corresponding to the light emitting area 35 in FIG. 3.

As shown in FIG. 4, the organic layer 5 is provided as a layer above the first electrode 4. The organic layer 5 is formed of a laminated film in which a hole injecting layer 14, a hole transporting layer 15, a light emitting layer 16, an electron transporting layer 17, and an electron injecting layer 18 are laminated from the first electrode 4. However, layers other than the light emitting layer 16 may be appropriately inserted as necessary. The transporting layer and the injecting layer may be integrated as one layer. In the present embodiment, as described above, an organic layer having a 5-layer structure of the hole injecting layer 14, the hole transporting layer 15, the light emitting layer 16, the electron transporting layer 17, and the electron injecting layer 18 is exemplified. In addition, as necessary, a layer for blocking movement of charges to an opposite electrode such as a hole blocking layer and an electron blocking layer may be appropriately added.

The hole injecting layer 14 is a layer having a function of increasing efficiency of hole injection from the first electrode 4 to the light emitting layer 16. As a material of the hole injecting layer 14, for example, benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or derivatives thereof, or heterocyclic conjugated monomers, oligomers or polymers such as a polysilane compound, a vinylcarbazole compound, a thiophene compound or an aniline compound may be used and molybdenum oxide is mixed with such organic materials. A mixing ratio between the organic material and the molybdenum oxide, is for example, the organic material at about 80% to molybdenum oxide at about 20%. The thickness of the hole injecting layer 14 is, for example, about 70 nm.

The hole transporting layer 15 is a layer having a function of increasing efficiency of hole transport from the first electrode 4 to the light emitting layer 16. For the hole transporting layer 15, the same organic material as the hole injecting layer 14 is used. Here, the hole injecting layer 14 and the hole transporting layer 15 may be integrated or may be formed as independent layers. The thickness of the hole transporting layer 15 is, for example, about 10 nm.

The light emitting layer 16 has a function of recombining holes injected from the first electrode 4 and electrons injected from the second electrode 6 and emitting light using deactivation energy. A material of the light emitting layer 16 includes, for example, a host material and a dopant material. Moreover, an assist material may be included. The host material is included at the highest proportion among constituent materials in the light emitting layer 16. A mixing ratio between the host material and the dopant material is, for example, the host material at about 90% to the dopant material at about 10%. The host material has a function of facilitating film formation of the light emitting layer 16 and maintaining the light emitting layer 16 in a film state. Therefore, as the host material, a stable compound in which hardly any crystallization occurs after film formation and hardly any chemical change occurs is necessary. In addition, the light emitting layer 16 has a function of recombining carriers in host molecules, transferring excitation energy to the dopant material, and causing the dopant material to emit light when an electric field is applied between the first electrode 4 and the second electrode 6. In the present embodiment, a bipolar material is used as the host material and a phosphorescent material is used as the dopant material. The thickness of the light emitting layer 16 is, for example, about 60 nm.

As a specific material of the light emitting layer 16, a material including a substance having a high luminous efficiency such as a low-molecular-weight fluorescent dye, a fluorescent polymer, and a metal complex may be exemplified. As a material of the light emitting layer 16, for example, anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or derivatives thereof, tris(8-quinolinolato)aluminum complex, bis(benzoquinolinolato)beryllium complex, tri(dibenzoylmethyl)phenanthroline europium complex, and ditolyl vinylbiphenyl may be exemplified.

The electron transporting layer 17 has a function of increasing efficiency of electron transport from the second electrode 6 to the light emitting layer 16. As a material of the electron transporting layer 17, for example, quinoline, perylene, phenanthroline, bisstyryl, pyrazine, triazole, oxazole, oxadiazole, fluorenone or derivatives thereof, and a metal complex may be used. Specifically, tris(8-hydroxyquinoline)aluminum, anthracene, naphthalene, phenanthrene, pyrene, anthracene, perylene, butadiene, coumarin, acridine, stilbene, 1,10-phenanthroline or derivatives thereof, and a metal complex may be used. The thickness of the electron transporting layer 17 is, for example, about 15 nm.

The electron injecting layer 18 has a function of increasing efficiency of electron injection from the second electrode 6 to the light emitting layer 16. As a material of the electron injecting layer 18, for example, the metal calcium (Ca) or lithium fluoride (LiF) may be exemplified. Here, the electron transporting layer 17 and the electron injecting layer 18 may be integrated or may be formed as independent layers. The thickness of the electron injecting layer 18 is, for example, about 0.5 nm.

A cap layer 21 is laminated on the top surface of the second electrode 6. The cap layer 21 functions as a protective layer for protecting the second electrode 6 and functions as an optical adjustment layer. Also, a color filter may be added to an upper layer side of the second electrode 6. Light emitted from the organic layer 5 passes through the color filter and thus it is possible to increase color purity of emitted light.

Specific configuration examples of the organic EL device 1 are shown, for example, in Table 1.

TABLE 1

| | Green unit light emitting area |
|---|---|
| Positive electrode | IZO: 100 nm |
| Hole injecting layer | Organic HTL material (80%): MoOx (20%) 70 nm |
| Hole transporting layer | Organic HTL material 10 nm |
| Light emitting layer | H (90%): d (10%) 60 nm |

TABLE 1-continued

| | Green unit light emitting area |
|---|---|
| | H: bipolar material |
| | d: phosphorescent material |
| Electron transporting layer | Organic ETL material |
| | 15 nm |
| Electron injecting layer | LiF |
| | 0.5 nm |
| Negative electrode | MgAg 1 nm/Ag 19 nm |
| Cap layer | 78 nm |

Light emitting layer H (host material), d (dopant material)

A process of manufacturing the organic EL device 1 having the above configuration will be described below with reference to FIG. 5 and FIG. 6.

In particular, a method of forming the first recess 9 will be mainly described.

First, as shown in FIG. 5(A), a positive photosensitive resin material is applied to the top surface 7a of the substrate 7 to form a resin layer 23.

Next, as shown in FIG. 5(B), the resin layer 23 is exposed through a photomask 24.

In this case, like a gray tone mask, the photomask 24 having a predetermined light transmission amount distribution, specifically, the photomask 24 whose light transmission amount near the center of a circular pattern is large and whose light transmission amount reduces toward the peripheral portions, is used. Accordingly, in the resin layer 23, an exposure amount near the center of a circular pattern is large and an exposure amount reduces toward the peripheral portions.

Next, as shown in FIG. 5(C), a predetermined developing solution is used to develop the resin layer 23. In this case, according to differences in the exposure amount of the resin layer 23, a film reduction amount of the resin layer 23 is large near the center of a circular pattern and reduces toward the peripheral portions. In this manner, the first recess 9 whose cross-sectional shape is parabolic is formed in the resin layer 23, and the underlayer 8 is formed. The shape of the parabolic curve can be controlled by the light transmission amount distribution and the exposure amount of the photomask 24 used during exposure.

Next, as shown in FIG. 5(D), a metal such as aluminum is deposited on the entire surface of the underlayer 8 and the reflective layer 3 is formed. The reflective layer 3 forms the concave reflective surface 3b in a portion covering the inner surface of the first recess 9.

Next, a method of forming the filling layer 12 will be exemplified.

First, as shown in FIG. 6(A), a resin layer 25 of a positive photosensitive resin material is formed on the entire surface of the reflective layer 3. As a method of forming the resin layer 25, for example, a spin coating method, a bar coating method or the like is used, and a liquid resin material is applied onto the reflective layer 3 and is then baked. In this case, the film thickness of the resin layer 25 is set so that the resin layer 25 fills the first recess 9 and also covers a flat portion of the reflective layer 3.

Next, as shown in FIG. 6(B), the resin layer 25 is exposed without using the photomask, and the filling layer 12 and the top surface 12a and the second recess 12b of the filling layer 12 are formed.

The exposure is performed by emitting ultraviolet rays L from the top surface 8a of the underlayer 8 in a normal direction. The resin layer 25 is gradually exposed from the top surface. In addition, ultraviolet rays L that have passed through the resin layer 25 are reflected at the concave reflective surface 3b and focused at the focus F. In addition, in the focus area FA that is positioned in the peripheral vicinity of the focus F, a certain amount or more of light is collected. Accordingly, the resin layer 25 is intensively exposed in the focus area FA. Further, when a part exposed by the developing solution is removed, the filling layer 12 and the top surface 12a and the second recess 12b of the filling layer 12 are formed.

Next, as shown in FIG. 6(C), on the flat surface 3a of the reflective layer 3 and the top surface 12a of the filling layer 12, the first electrode 4, the organic layer 5, and the second electrode 6 are sequentially formed. The first electrode 4, the organic layer 5, and the second electrode 6 are formed according to a known process. For example, a pattern may be formed according to a vacuum deposition method using a shadow mask. The method is not limited thereto, and a spray method, an ink jet method, a printing method, a laser transfer method, and the like can be used.

According to the above processes, the organic EL device 1 of the present embodiment is completed.

Operations and effects of the organic EL device according to the present embodiment will be described below.

FIG. 7(A) is a cross-sectional view showing an organic EL device 101 in the related art.

The organic EL device 101 has a configuration in which a reflective layer 103, a first electrode 104, an organic layer 105, and a second electrode 106 are sequentially laminated on a substrate 102. In the organic EL device 101, light emitted from a light emitting layer in the organic layer 105 is uniformly emitted in all directions, and travels inside while being refracted at the interface between layers having different refractive indexes. Light having traveled toward the substrate 102 is reflected at the reflective layer 103.

Since there is a refractive index difference at the interface between the second electrode 106 and an external space (air), light incident at a small angle of incidence with respect to the interface is emitted to the external space and light incident at a large angle of incidence is reflected at the interface and travels inside again. For example, light L1 emitted from an arbitrary light-emitting point M in the organic layer 105 in a direction close to a horizontal direction is refracted at the interface between layers and hardly any thereof is emitted to the external space even if an angle slightly changes.

In a path of light traveling in the organic EL device 101, at the interface between the second electrode 106 and the external space (air), a loss due to light reflection does not occur. On the other hand, at the interface between the first electrode 104 and the reflective layer 103, in general, since a reflectance of a metal of the reflective layer 103 is not 100%, a loss due to light reflection occurs. Further, some light is absorbed by each layer while traveling in the organic EL device 101. Therefore, light attenuates while traveling inside the organic EL device 101. In general, a refractive index of the organic layer 105 is about 1.8. In this case, from light emitted from the light emitting layer, a proportion of light extracted to the external space is about 20%.

As a result, the organic EL device 101 of the related art has a problem of low light use efficiency.

On the other hand, in the organic EL device 1 of the present embodiment, as shown in FIG. 7(B), the reflective layer 3 is curved along the first recess 9 and the concave reflective surface 3b is formed. In addition, on the top surface 12a of the filling layer 12, the second recess 12b corresponding to the focus area FA of the concave reflective surface 3b is provided. Within the light emitting area 35, the first light emitting area 35A positioned inside the second recess 12b is formed to include the focus F. Light L1 emitted from the light-emitting point M positioned at the focus F in the first light emitting area 35A is reflected at the concave reflective surface 3b. Accordingly, light L1 has a traveling direction that is changed and has an angle of incidence that is smaller than a critical angle at the interface between the second electrode 6 and the external space, and the light is extracted to the external space.

In the present embodiment, since the first recess 9 has a parabolic shape, the concave reflective surface 3b of the surface of the reflective layer 3 formed along the inner surface of the first recess 9 also has a parabolic shape. Therefore, light L1 that is emitted from the light-emitting point M positioned at the focus F and reflected at the concave reflective surface 3b is reflected at the reflective layer 3 and then travels in a direction parallel to the central axis C of a parabolic curve, that is, a direction perpendicular to an interface with the external space of the organic EL device 1. Light L1 is emitted from the light-emitting point M in all directions. However, regardless of the direction in which light L1 is emitted, the light L1 is reflected at the reflective layer 3 and then travels in a direction parallel to the central axis C of a parabolic curve.

In addition, light emitted from a light-emitting point positioned in the focus area FA that is positioned near the focus F in the first light emitting area 35A also follows substantially the same path as the light L1 emitted from the focus F and is extracted to the external space. In this manner, light emitted from the first light emitting area 35A is reflected at the concave reflective surface 3b and is efficiently extracted to the external space.

According to the organic EL device 1 of the present embodiment, in the periphery of the first recess 9, the reflective layer 3 is in contact with the first electrode 4. Therefore, a bottom surface 5b of the organic layer 5 positioned inside the second recess 12b is positioned lower than the plane Q including the edge 3c. Accordingly, the reflective layer 3 is on the side of the organic layer 5 positioned inside the second recess 12b. Light L1 emitted from the first light emitting area 35A in a direction close to a horizontal direction is reflected at the reflective layer 3 and has an angle of the traveling direction that is changed and the light is extracted to the external space. In this manner, when the first light emitting area 35A is positioned inside the second recess 12b, it is possible to extract light emitted from the first light emitting area more reliably to the outside.

In general, when the parabolic curve is represented by a quadratic function on xy coordinates, $y = Ax^2$ is established. In this case, a focus area of the parabolic curve includes positional coordinates $(0, 1/(4A))$ and the periphery thereof. The position of the light emitting area 35 and the shape of the recess may be set so that the focus area is positioned inside the light emitting area 35.

Within the light emitting area 35, some light that is emitted in a horizontal direction from the second light emitting area 35B and the third light emitting area 35C positioned outside the second recess 12b in a plan view travels in the horizontal direction. It is desirable that this light be extracted to the outside as soon as possible in order to reduce a loss and absorption.

As shown in FIG. 2, in the organic EL device 1 of the present embodiment, the first recess 9 is disposed adjacent to the base material 2. Accordingly, light traveling in a horizontal direction passes through the inside of the first recess 9 in a plan view and is reflected at the concave reflective surface 3b and has a traveling direction that is changed, and is extracted to the external space. In this manner, the organic EL device 1 of the present embodiment can efficiently extract not only light of the first light emitting area 35A positioned inside the second recess 12b but also light of the second light emitting area 35B and the third light emitting area 35C positioned outside the second recess 12b to the outside.

In order to verify an effect of the organic EL device 1 of the present embodiment, the inventors produced an organic EL device (Example 1) of the present embodiment.

Procedures of producing the organic EL device of Example 1 will be described below in detail.

First, as shown in FIG. 5(A), a photosensitive acrylic resin (JAS100JSR commercially available from Corporation) was applied to the top surface 7a of the substrate 7 using a spin coating method at a rotational speed of 1000 rpm for a rotation time of 10 seconds, and additionally baked on a hot plate at 150° C. for 2 minutes, and the resin layer 23 was formed.

Next, as shown in FIG. 5(B), the resin layer 23 was exposed through the photomask 24.

Here, a mask in which patterns with a diameter of 4 μm were disposed at pitches of 5 μm was used. In addition, an exposure time was 0.5 seconds.

In addition, as a developing solution, 0.1% tetraammonium hydroxide (TMAH) was used for developing for 2 minutes, and the first recess 9 was formed. Then, a UV exposure device was used to perform exposure for 20 seconds without using a photomask and calcination was additionally performed in an oven at 200° C. for 60 minutes. Accordingly, as shown in FIG. 5(C), the first recess 9 whose cross-sectional shape was parabolic was formed in the resin layer 23.

Next, as shown in FIG. 5(D), aluminum was deposited on the entire surface of the underlayer 8 using a sputtering method and the reflective layer 3 having a thickness of 100 nm was formed. The reflective layer 3 formed the concave reflective surface 3b in a portion covering the inner surface of the first recess 9.

Next, as shown in FIG. 6(A), a photosensitive acrylic resin (JAS100 commercially available from JSR Corporation) was applied to the entire surface of the reflective layer 3 using a spin coating method at a rotational speed of 1500 rpm for a rotation time of 20 seconds, and additionally baked on a hot plate at 150° C. for 2 minutes, and the resin layer 25 was formed.

Next, a UV exposure device was used to perform exposure without using a photomask. The exposure time was 1 second. Then, as a developing solution, 0.1% tetraammonium hydroxide (TMAH) was used for 2 minutes for developing. In addition, the UV exposure device was used to perform exposure for 20 seconds without using a photomask and calcination was then performed in an oven at 200° C. for 60 minutes. Accordingly, as shown in FIG. 6(B), the filling layer 12 and the top surface 12a and the second recess 12b of the filling layer 12 were formed.

Further, the first electrode 4, the organic layer 5, and the second electrode 6 described in detail based on [Table 1] were formed according to a known process and the organic EL device of Example 1 having the structure shown in FIG. 6(C) was obtained. Here, an edge cover in which an area of 2 mm×2 mm was open according to photo etching processing was formed between the first electrode 4 and the organic layer 5, and a light emitting area of 2 mm×2 mm was set.

Optical characteristics of the organic EL device of Example 1 produced in this manner and a bottom emission type organic EL device (a conventional example) were compared. A luminance current efficiency (cd/A) was used as an evaluation item. In order to easily analyze a phenomenon, a measurement result from the front direction was used as the evaluation item. Here, both samples were green light emitting elements.

The measurement results are shown in Table 2.

TABLE 2

|  | Conventional example | Example 1 |
|---|---|---|
| Luminance current efficiency (cd/A) | 1 | 1.8 |

As shown in Table 2, a luminance current efficiency of Example 1 was 1.8 times a luminance current efficiency of the conventional example. Accordingly, it was verified that a high luminance organic EL device with low power consumption can be realized.

Here, while the green light emitting element has been exemplified in the present embodiment, the same effect can be obtained in other color light emitting elements such as a red light emitting element and a blue light emitting element. The above effect is not limited to a specific luminescent color. In addition, in the above verification result, the green light emitting element had a specific numerical value, and the same result was also obtained from the red light emitting element and the blue light emitting element.

<Modification>

A modification of the first embodiment will be described below with reference to FIG. 8.

While the parabolic curve has been used as a curve line forming the focus F in the above-described first embodiment, for example, an arcuate cross-sectional shape, may be used in addition to the parabolic curve. Such a case will be described below as a modification.

FIG. 8 is a diagram showing an organic EL device 1X according to a modification of the present embodiment. The organic EL device 1X has the same basic configuration as the first embodiment except that a first recess 9X has a different shape. Here, elements common to the drawings used in the first embodiment are denoted by the same reference numerals and detailed description will be omitted.

In the organic EL device 1X of the modification, the first recess 9X is formed on the top surface 8a of the underlayer 8. An inner surface of the first recess 9X has an arc shape with the lowest point 9B at the center of the first recess 9X and with a center along a central axis C perpendicular to the top surface 7a of the substrate 7. The cross-sectional shape of the first recess 9X is the same arc shape when it is cut along a plane in any direction as long as it is a plane perpendicular to the top surface 7a of the substrate 7. Here, in this modification, a case in which the cross-sectional shape of the first recess 9X is an arc shape obtained by cutting a part of a circle whose long axis and short axis have the same length is exemplified. Here, the arc shape is a concept that includes a so-called elliptical arc shape in which a part of an ellipse whose long axis and short axis have different lengths is cut with a straight line parallel to the long axis or the short axis.

A reflective layer 3X is formed on the top surface 8a of the underlayer 8 including an inner surface of the first recess 9X.

The reflective layer 3X forms a concave reflective surface 3Xb in a portion covering the inner surface of the first recess 9X. Since the first recess 9X includes an arcuate curved surface, the concave reflective surface 3Xb has an arc shape.

The concave reflective surface 3Xb forms a focus FX at which light from a normal direction is focused and light from the top surface 8a in a normal direction is focused. In addition, the concave reflective surface 3Xb forms a focus area FAX in the peripheral vicinity of the focus FX. Since the concave reflective surface 3Xb has an arcuate cross section, a focusing ability is inferior to that of the parabolic shape, and the focus area FAX is wider than the focus area FAX of the first embodiment.

In this manner, it is also possible to manufacture the organic EL device 1X in which the concave reflective surface 3Xb has an arcuate cross-sectional shape using the same method as in the organic EL device 1 of the first embodiment and the same effect can be obtained.

Second Embodiment

A second embodiment of the present invention will be described below with reference to FIG. 9 and FIG. 10.

An organic EL device 201 of the second embodiment has the same basic configuration as that of the first embodiment except that a configuration of a filling layer 212 is different from that of the first embodiment. In FIG. 9 and FIG. 10, elements common to the drawings used in the first embodiment are denoted by the same reference numerals and detailed description will be omitted.

FIG. 9 is a cross-sectional view of the organic EL device according to the second embodiment. FIG. 9 is a diagram corresponding to FIG. 3 for describing the above-described first embodiment.

As shown in FIG. 9, the organic EL device 201 includes the base material 2, the reflective layer 3, the filling layer 212, a first electrode 204, an organic layer 205 including a light emitting layer, and a second electrode 206. The base material 2 includes the substrate 7 and the underlayer 8. On the top surface 8a of the underlayer 8, the reflective layer 3, the first electrode 204, the organic layer 205, and the second electrode 206 are laminated in that order from the substrate 7. In addition, the first recess 9 is provided on the top surface 8a of the underlayer 8, and the first recess 9 is filled with the filling layer 212 with the reflective layer 3 therebetween.

The first recess 9 is filled with the filling layer 212. On a top surface 212a of the filling layer 212, a second recess 212b that opens upward is provided. The second recess 212b is positioned to overlap and correspond to the focus area FA that the concave reflective surface 3b forms. Within the top surface 212a of the filling layer 212, an area other than the area in which the second recess 212b is provided has a flat surface or a surface inclined toward the second recess 212b.

The topmost part of the top surface 212a of the filling layer 212 is positioned lower than the plane Q including the edge 3c of the reflective layer 3 formed on the surface of the first recess 9.

The first electrode 204 is formed over the top surface 212a of the filling layer 212 and the flat surface 3a of the reflective layer 3. The first electrode 204 has a step at a portion that is formed on the edge 3c of the concave reflective surface 3b. Within the first electrode 204, a portion positioned on the top surface 8a of the underlayer 8 is in contact with a part of the reflective layer 3. At a position inside the first recess 9, a bottom surface of the first electrode 204 is in contact with the top surface 212a of the filling layer 212. Since the topmost part of the top surface 212a of the filling layer 212 is positioned lower than the plane Q including the edge 3c of the concave reflective surface 3b, a bottom surface of the first electrode 204 is positioned lower than the plane Q including the edge 3c of the reflective layer 3. In addition, in the present embodiment, a top surface of the first electrode 204 is also positioned lower than the plane Q.

In addition, a part of the first electrode 204 is formed inside the second recess 212b formed on the top surface 212a of the filling layer 212.

The organic layer 205 is laminated along a top surface of the first electrode 204. As described above, since the top surface of the first electrode 204 is positioned lower than the plane Q, a bottom surface of the organic layer 205 is positioned lower than the plane Q. The organic layer 205 forms a light emitting area 235 that is interposed between the first electrode 204 and the second electrode 206. In addition, a part of the organic layer 205 is formed inside the second recess 212b. A part of the light emitting area 235 is positioned inside the second recess 212b. Within the light emitting area 235, a portion positioned inside the second recess 212b in a plan view is set as a first light emitting area 235A. Within the light emitting area 235, a portion that is positioned outside the second recess 212b and positioned inside the first recess 9 in a plan view is set as a second light emitting area 235B. In addition, within the light emitting area 235, a portion positioned outside the first recess 9 in a plan view is set as a third light emitting area 235C. A bottom surface of the organic layer 205 inside the second recess 212b is positioned lower than the plane Q.

The organic layer 205 is a laminate formed of an organic material including a hole injecting layer, a hole transporting layer, a light emitting layer, an electron transporting layer and an electron injecting layer.

The second electrode 206 is laminated along a top surface of the organic layer 205.

While the organic EL device 201 of the second embodiment can be produced according to substantially the same procedures as in the first embodiment, there is a difference in the process of forming the filling layer 212. A method of manufacturing the organic EL device 201 will be described focusing on different portions based on the same drawings as in the first embodiment.

First, in the same manner as in the first embodiment, the substrate 7, the underlayer 8 in which the first recess 9 is provided, and the reflective layer 3 are formed and the state shown in FIG. 5(D) is obtained.

Next, in the same manner as in the first embodiment, as shown in FIG. 6(A), the resin layer 25 of a positive photosensitive resin material is formed on the entire surface of the reflective layer 3.

Next, in the same manner as in the first embodiment, as shown in FIG. 6(B), the resin layer 25 is exposed without using a photomask, and a part exposed by the developing solution is then removed. In this step, as shown in FIG. 6(B), a top surface (the top surface 12a in FIG. 6(B)) of the resin layer 25 is the same surface as the plane Q.

Further, for example, the surface of the filling layer 212 is etched back using a plasma ashing (dry ashing) method. In this case, an amount of etch back is adjusted so that a top surface of the resin layer 25 is positioned lower than the plane Q. Accordingly, the filling layer 212 including the top surface 212a positioned lower than the plane Q is formed.

Incidentally, in the concave reflective surface 3b, a depth at which the focus F and the focus area FA in the peripheral vicinity thereof are formed is changed depending on its shape. When the focus area FA is formed at a deep position of the first recess 9, in the above-described exposure process, an unexposed part remains in the resin layer 25 above the focus area FA, and there is a possibility of the second recess 212b of the filling layer 212 not being open. However, as shown in the present embodiment, when plasma ashing is performed on the filling layer 212, the top surface 212a positioned lower than the plane Q is formed, and a part exposed by the developing solution is removed again, it is possible to open the second recess 212b reliably. Therefore, according to the manufacturing method of the present embodiment, it is possible to form the focus area FA in a deep area of the first recess.

Next, in the same manner as in the first embodiment, the first electrode 204, the organic layer 205, and the second electrode 206 are sequentially formed.

According to the above processes, the organic EL device 201 of the present embodiment is completed.

Operations and effects of the organic EL device 201 of the present embodiment will be described below. The organic EL device 201 has the same effect as in the first embodiment and also has an effect to be described below.

FIG. 10 is an enlarged view of an area B in FIG. 9 and is a diagram showing the periphery of the edge 3c of the concave reflective surface 3b of the organic EL device 201.

From light emitted from the second light emitting area 235B, light L2 incident at an angle smaller than a critical angle at the interface between the organic layer 205 and the first electrode 204 travels in a lateral direction. In a structure of the related art, it is not possible to extract light that travels in the lateral direction as described above, which results in low light use efficiency.

In the organic EL device 201 of the present embodiment, the topmost part of the top surface 212a of the filling layer 212 is positioned lower than the plane Q including the edge 3c of the reflective layer 3 formed in the first recess 9. Accordingly, a bottom surface of the first electrode 204 formed on the top surface 212a of the filling layer 212 is also positioned lower than the plane Q of the reflective layer 3. Therefore, the concave reflective surface 3b is disposed on the side of the first electrode 204, and light that is emitted from the second light emitting area 235B and travels inside the first electrode 204 in a horizontal direction can also enter the concave reflective surface 3b and can be extracted upward. Accordingly, it is possible to increase light use efficiency.

Furthermore, in the organic EL device 201 of the present embodiment, a bottom surface of the organic layer 205 is positioned lower than the plane Q. Accordingly, the concave reflective surface 3b is disposed on the side of the organic layer 205, and light L2 that is emitted from the second light emitting area 235B and is emitted from a light-emitting point in the organic layer 205 in a horizontal direction can also enter the concave reflective surface 3b.

Here, in the present embodiment, since the top surface 212a of the filling layer 212 is positioned lower than the plane Q and a bottom surface of the organic layer 205 is positioned lower than the plane Q, light that is emitted from a light-emitting point in the organic layer 205 in a substantially horizontal direction can also enter the reflective layer 3. However, if the top surface 212a of the filling layer 212 is on the same plane as the plane Q, a bottom surface 205b of the organic layer 205 is positioned higher than the plane Q. In this case, since the concave reflective surface 3b is not provided on the side of the organic layer 205, light traveling from a light-emitting point in the organic layer 205 in a substantially horizontal direction does not enter the concave reflective surface 3b. However, even in this case, compared to the organic EL device 101 (refer to FIG. 7(A)) of the related art, a proportion of light emitted from a light-emitting point in the organic layer 205 within a predetermined angle range close to a horizontal direction that enters the concave reflective surface 3b sufficiently increases. Therefore, in such a configuration, it is also possible to increase light use efficiency.

In order to verify an effect of the organic EL device 201 of the present embodiment, the inventors produced an organic EL device (Example 2) of the present embodiment.

Example 2 was manufactured using the same method as in Example 1, but there was a difference in the process of forming the filling layer 212.

When the filling layer 212 was formed, after the same process as in Example 1 was performed, plasma ashing was additionally performed, the filling layer 212 was etched back, and a top surface of the filling layer 212 was positioned lower than the plane Q. Plasma ashing was performed under conditions of an ultimate vacuum of $1 \times 10^{-3}$ Pa, an input power of 500 W, and an oxygen gas flow rate of 1000 sccm. Here, the unit sccm is an abbreviation for Standard Cubic Centimeter per Minute, and indicates a flow rate for each cubic centimeter in the standard state.

Optical characteristics of the organic EL device of Example 2 produced in this manner and a bottom emission type organic EL device (a conventional example) were compared. A luminance current efficiency (cd/A) was used as an evaluation item. In order to easily analyze a phenomenon, a measurement result from the front direction was used as the evaluation item. Here, both samples were green light emitting elements.

The measurement results are shown in Table 3.

TABLE 3

| | Conventional example | Example 2 |
|---|---|---|
| Luminance current efficiency (cd/A) | 1 | 2.0 |

As shown in Table 3, it was found that a luminance current efficiency of Example 2 was 2.0 times a luminance current efficiency of the conventional example. Accordingly, it was verified that a high luminance organic EL device with low power consumption can be realized.

Here, while the green light emitting element has been exemplified in the present embodiment, the same effect can be obtained in other color light emitting elements such as a red light emitting element and a blue light emitting element. The above effect is not limited to a specific luminescent color. In addition, in the above verification result, the green light emitting element had a specific numerical value, and the same result was also obtained from the red light emitting element and the blue light emitting element.

Third Embodiment

A third embodiment of the present invention will be described with reference to FIG. 11 and FIG. 12.

An organic EL device 301 of the third embodiment has the same basic configuration as those of the first embodiment and the second embodiment except that an insulating layer 310 is provided between a first electrode 304 and an organic layer 305, which is a main difference. In FIG. 11 and FIG. 12, elements common to the drawings used in the first embodiment and the second embodiment are denoted by the same reference numerals and detailed description will be omitted.

FIG. 11 is a plan view of the organic EL device 301 viewed from a top surface in a normal direction and shows an enlarged part.

As shown in FIG. 11, the organic EL device 301 includes the base material 2 and the plurality of first recesses 9 that are provided in the base material 2. In addition, the organic EL device 301 includes a light emitting area 335 inside the first recess 9 in a plan view, and the other portion is a non-light emitting area 336.

FIG. 12 is a cross-sectional view of the organic EL device 301 taken along a plane perpendicular to a top surface of the base material 2 and is a cross-sectional view along the line A-A' in FIG. 11.

As shown in FIG. 12, the organic EL device 301 includes the base material 2, the reflective layer 3, a filling layer 312, the first electrode 304, the organic layer 305 including a light emitting layer, and a second electrode 306. The base material 2 includes the substrate 7 and the underlayer 8. On the top surface 8a of the underlayer 8, the reflective layer 3, the first electrode 304, the organic layer 305, and the second electrode 306 are laminated in that order from the substrate 7. In addition, the first recess 9 is provided on the top surface 8a of the underlayer 8. The first recess 9 is filled with the filling layer 312 with the reflective layer 3 therebetween.

The first recess 9 is filled with the filling layer 312. A second recess 312b that opens upward is provided on a top surface 312a of the filling layer 312. The second recess 312b is positioned to overlap and correspond to the focus area FA that the concave reflective surface 3b forms. Within the top surface 312a of the filling layer 312, an area other than the area in which the second recess 312b is provided has a flat surface or a surface inclined toward the second recess 312b.

The topmost part of the top surface 312a of the filling layer 312 is positioned lower than the plane Q including the edge 3c of the reflective layer 3 formed on the surface of the first recess 9.

The first electrode 304 is formed over the top surface 312a of the filling layer 312 and the flat surface 3a of the reflective layer 3. The first electrode 304 has a step at a portion that is formed on the edge 3c of the concave reflective surface 3b. Within the first electrode 304, a portion positioned on the top surface 8a of the underlayer 8 is in contact with a part of the reflective layer 3. A bottom surface of the first electrode 304 is positioned lower than the plane Q including the flat surface 3a of the reflective layer 3. In addition, in the present embodiment, a top surface of the first electrode 304 is also positioned lower than the plane Q.

In addition, a part of the first electrode 304 is formed inside the second recess 312b that is formed on the top surface 312a of the filling layer 312.

The insulating layer 310 is formed on the top surface of the first electrode 304. The insulating layer 310 forms an aperture 310h inside the second recess 312b. As a material of the insulating layer 310, for example, an acrylic, epoxy, or polyimide resin is used, similarly to the filling layer 312. The insulating layer 310 is interposed between the first electrode 304 and the second electrode 306 (more specifically, between the first electrode 304 and the organic layer 305), and blocks hole movement from the first electrode 304 to the organic layer 305. Therefore, an area in which the insulating layer 310 is interposed between the first electrode 304 and the second electrode 306 is the non-light emitting area 336 in which no light is emitted from the light emitting layer. On the other hand, an area corresponding to the aperture 310h of the insulating layer 310 is the light emitting area 335 in which the first electrode 304, the organic layer 305 and the second electrode 306 are laminated without the insulating layer 310 interposed therebetween and thus light is emitted. That is, in the organic EL device 301, the first electrode 304, the organic layer 305, and the second electrode 306 are laminated inside the aperture 310h to form the light emitting area 335. A planar shape and a size of the light emitting area 335 are determined by the aperture 310h of the insulating layer 310. A step of the first electrode 304 at the edge of the first recess 9 is planarized by the insulating layer 310.

Here, while a case in which the insulating layer 310 is positioned between the first electrode 304 and the organic layer 305 has been exemplified in the present embodiment, the insulating layer 310 may be positioned between the organic layer 305 and the second electrode 306.

The organic layer 305 is laminated along a top surface of the first electrode 304. As described above, since the top surface of the first electrode 304 is positioned lower than the plane Q including the edge 3c, a bottom surface of the organic layer 305 is positioned lower than the plane Q. A part of the organic layer 305 is formed inside the second recess 312b, and the light emitting area 335 that the organic layer 305 forms is positioned inside the second recess 312b. A bottom surface of the organic layer 305 inside the second recess 312b is positioned lower than the plane Q.

The organic layer 305 is a laminate formed of an organic material including a hole injecting layer, a hole transporting layer, a light emitting layer, an electron transporting layer and an electron injecting layer.

The second electrode 306 is laminated along a top surface of the organic layer 305.

Operations and effects of the organic EL device 301 of the present embodiment will be described below. The organic EL device 301 has the same effect as in the first embodiment and also has an effect to be described below.

In the organic EL device 301 of the present embodiment, the light emitting area 335 is defined in a sufficiently narrow area due to the insulating layer 310. In addition, the aperture 310h of the insulating layer 310 is provided at a position overlapping the focus area FA of the concave reflective surface 3b in a plan view and the light emitting area 335 is disposed to be positioned in the focus area FA. Accordingly, all light emitted downward from the light emitting area 335 is reflected at the concave reflective surface 3b and travels in a direction perpendicular to the top surface 8a. Therefore, according to the organic EL device 301, it is possible to increase light use efficiency.

In addition, the light emitting area 335 of the present embodiment is positioned only inside the second recess 312b. In addition, inside the second recess 312b, a bottom surface of the organic layer 305 including the light emitting area 335 is positioned lower than the plane Q including the edge 3c of the concave reflective surface 3b. Therefore, light emitted from the light emitting area 335 in a horizontal direction can also be reflected at the concave reflective surface 3b and extracted to the external space. Accordingly, it is possible to increase light use efficiency.

In order to verify an effect of the organic EL device 301 of the present embodiment, the inventors produced an organic EL device (Example 3) of the present embodiment.

Example 3 was manufactured using the same method as in Example 2. However, after the first electrode 304 was formed, a process of forming the insulating layer 310 was additionally added.

The insulating layer 310 was formed by, after the first electrode 304 was formed, applying a photosensitive acrylic resin (JAS100 commercially available from JSR Corporation), performing baking thereon, and then performing a pattern exposure for forming the aperture 310h, and a photosensitive portion was additionally removed using a developing solution.

Optical characteristics of the organic EL device of Example 3 produced in this manner and a bottom emission type organic EL device (a conventional example) were compared. A luminance current efficiency (cd/A) was used as an evaluation item. In order to easily analyze a phenomenon, a measurement result from the front direction was used as the evaluation item. Here, both samples were green light emitting elements.

The measurement results are shown in Table 4.

TABLE 4

| | Conventional example | Example 3 |
|---|---|---|
| Luminance current efficiency (cd/A) | 1 | 2.5 |

As shown in Table 4, a luminance current efficiency of Example 3 was 2.5 times a luminance current efficiency of the conventional example. Accordingly, it was verified that a high luminance organic EL device with low power consumption can be realized.

Here, while the green light emitting element has been exemplified in the present embodiment, the same effect can be obtained in other color light emitting elements such as a red light emitting element and a blue light emitting element. The above effect is not limited to a specific luminescent color. In addition, in the above verification result, the green light emitting element had a specific numerical value, and the same result was also obtained from the red light emitting element and the blue light emitting element.

Fourth Embodiment

A fourth embodiment of the present invention will be described below with reference to FIG. 13.

In the fourth embodiment, a case in which an organic EL device according to an aspect of the present invention is applied to, for example, a display device including a plurality of pixels that are disposed in a matrix form will be exemplified.

While the organic EL device having the same configuration as that of the first embodiment will be described, the organic EL device may have the same configuration as those of the second and third embodiments.

FIG. 13 is a plan view of an organic EL device 401 according to the fourth embodiment. In FIG. 13, elements common to FIG. 2 used in the first embodiment are denoted by the same reference numerals and detailed description will be omitted.

As shown in FIG. 13, the organic EL device 401 of the present embodiment includes a plurality of pixels P that are disposed in a matrix form. One pixel P includes three subpixels including a first subpixel SPA, a second subpixel SPB, and a third subpixel SPC. The first subpixel SPA, the second subpixel SPB, and the third subpixel SPC of the present embodiment each have a square shape, but may have a rectangular shape. Each of the first subpixel SPA, the second subpixel SPB, and the third subpixel SPC has a size with a length of 2 mm and a width of 2 mm. The first subpixel SPA emits red light. The second subpixel SPB emits green light. The third subpixel SPC emits blue light. Each of the subpixels SPA, SPB, and SPC includes a plurality of first recesses 9 similarly to the first embodiment.

The first subpixel SPA, the second subpixel SPB, and the third subpixel SPC correspond to unit display areas in the appended claims.

An electric field can be independently applied to (drive) each of the first subpixel SPA, the second subpixel SPB, and the third subpixel SPC. In the present embodiment, a plurality of data lines 72 and a plurality of scanning lines 73 are provided on the base material 2 to cross each other, and one subpixel SPA, SPB, or SPC is provided in an area surrounded by the data lines 72 adjacent to each other and the scanning lines 73 adjacent to each other. First electrodes 4 described in the first embodiment are separated for each subpixel, and the first electrodes 4 are connected to the data lines 72 and the scanning lines 73 through switching elements 74 such as a thin film transistor (hereinafter abbreviated as TFT). That is, the organic EL device 401 of the present embodiment is an organic EL device using an active matrix method. Here, as a method in which an electric field is independently applied to the subpixels SPA, SPB, and SPC, the active matrix method using a TFT is used, but the present invention is not limited to this method. For example, a method such as a simple matrix method and a segment driving method may be used.

In the present embodiment also, similarly to the first to third embodiments, it is possible to realize the organic EL device 401 having excellent light use efficiency. In particular, in the present embodiment, it is possible to realize a high luminance organic EL display with low power consumption.

Note that the technical scope of the present invention is not limited to the above embodiments, and various modifications can be made without departing from the spirit of the invention.

While a case in which the recess has a cross-sectional shape that is a parabolic shape or an arc shape has been described in the above embodiment, the shape may include a conic curve, for example, an elliptical or hyperbolic curve, and the shape may include a curve line on the bottom side and a straight line on the top side. The planar shape of the recess is not limited to a circular or rectangular shape, and other shapes may be used. In addition, the planar shapes of the recesses may not necessarily be the same, and a plurality of types of recesses having different shapes may be included.

In addition, specific configurations such as shapes, sizes, the numbers thereof, dispositions, constituent materials, and formation processes of elements of the organic EL device are not limited to those in the above embodiment, and can be appropriately changed. In addition, the organic EL device according to one aspect of the present invention can be applied to an illumination device in addition to a display device.

Some aspects of the present invention can be used for any electronic product including a light emitting unit such as a display device or an illumination device.

DESCRIPTION OF THE REFERENCE SYMBOLS 1, 1X, 101, 201, 301, 401 Organic EL device
2, 102 Base material
3, 3X, 103 Reflective layer
3b, 3Xb Concave reflective surface
3c Edge
4, 104, 204, 304 First electrode
5, 105, 205, 305 Organic layer
6, 106, 206, 306 Second electrode
7 Substrate
7a, 8a, 12a, 212a, 312b Top surface
8 Underlayer
9, 9X First recess
12, 212, 312 Filling layer
12b, 212b, 312b Second recess
35, 235, 335 Light emitting area
310 Insulating layer
310h Aperture
500W Input power
B Area
C Central axis
F Focus
FA, FAX Focus area
L Ultraviolet rays
L1, L2 Light
P Pixel
Q Plane

The invention claimed is:

1. An organic electroluminescence device comprising:
a base material;
a first recess provided on a top surface of the base material;
a reflective layer provided along at least a surface of the first recess;
a filling layer filled in the first recess, the filling layer comprising a top surface on which a second recess is provided, the filling layer having light transmissivity;
a first electrode provided on an upper layer side of at least the filling layer, the first electrode having light transmissivity;
an organic layer comprising a light emitting layer provided on an upper layer side of the first electrode; and
a second electrode provided on an upper layer side of the organic layer, the second electrode having light transmissivity and light reflectivity,
wherein, within the organic layer, at least a part of a light emitting area interposed between the first electrode and the second electrode is positioned inside the second recess, and
wherein the reflective layer is in contact with the first electrode in a periphery of the first recess.

2. The organic electroluminescence device according to claim 1,
wherein a topmost part of the filling layer is positioned lower than an edge of the reflective layer formed in the first recess.

3. The organic electroluminescence device according to claim 1,
wherein the reflective layer forms a concave reflective surface along the surface of the first recess,
wherein, among a plurality of planes perpendicular to the top surface of the base material, at least a part of a cross-sectional shape of the concave reflective surface cut along at least one plane includes a curve line having a focus, and
wherein the focus is included in the light emitting area inside the second recess.

4. The organic electroluminescence device according to claim 3,
wherein, among a plurality of planes perpendicular to the top surface of the base material, a cross-sectional shape of the concave reflective surface cut along at least one plane is an arc shape.

5. The organic electroluminescence device according to claim 3,
wherein, among a plurality of planes perpendicular to the top surface of the base material, a cross-sectional shape of the concave reflective surface cut along at least one plane is a parabolic curve.

6. The organic electroluminescence device according to claim 1, wherein an insulating layer having an aperture including at least the second recess viewed from the top surface in a normal direction is provided on an upper layer side of the first electrode and a lower layer side of the second electrode, and wherein the light emitting area is positioned inside the aperture.

7. The organic electroluminescence device according to claim 1, the organic electroluminescence device comprising:

a plurality of unit display areas, wherein the unit display areas include the plurality of first recesses.

8. A method for manufacturing an organic electroluminescence device, the method comprising:

forming a first recess on a top surface of a base material;

forming a reflective layer provided along at least a surface of the first recess, the reflective layer including a concave reflective surface containing a curve line having a focus in at least a part of a cross-sectional shape;

forming a filling layer in which a second recess that is open upward is provided, wherein a resin layer having photosensitivity and light transmissivity fills the first recess, light is then emitted from the top surface in a normal direction, light reflected at the concave reflective surface is focused at the focus, and the resin layer positioned at the focus is exposed and removed;

forming a first electrode having light transmissivity on an upper layer side of at least the filling layer;

forming an organic layer comprising a light emitting layer on an upper layer side of the first electrode; and forming a second electrode having light transmissivity and light reflectivity on an upper layer side of the organic layer.

* * * * *